US005751231A

United States Patent [19]
Iverson

[11] Patent Number: 5,751,231
[45] Date of Patent: May 12, 1998

[54] METHOD AND APPARATUS FOR RUN-LENGTH ENCODING USING SPECIAL LONG-RUN CODES

[75] Inventor: Vaughn Iverson, Beaverton, Oreg.

[73] Assignee: Intel Corporation, Santa Clara, Calif.

[21] Appl. No.: 670,453

[22] Filed: Jun. 26, 1996

[51] Int. Cl.$^6$ .................................................. H03M 7/00
[52] U.S. Cl. ............................................................ 341/59
[58] Field of Search ............................... 341/59, 58, 61

[56] References Cited

U.S. PATENT DOCUMENTS

| | | | |
|---|---|---|---|
| 3,739,085 | 6/1973 | Rosen et al. | 178/6 |
| 3,830,963 | 8/1974 | Garcia | 178/6 |
| 4,121,259 | 10/1978 | Preuss et al. | 358/261 |
| 4,441,208 | 4/1984 | Iida | 382/56 |
| 4,542,413 | 9/1985 | Rallapalli et al. | 358/261 |

*Primary Examiner*—Jeffrey A. Gaffin
*Assistant Examiner*—Jason L. W. Kost
*Attorney, Agent, or Firm*—Duane, Morris & Heckscher LLP

[57] ABSTRACT

Magnitudes of runs of constant signal value in signals representative of physical activities or objects are determined. The signals are converted to fixed-length run-length (RL) codes, wherein each long run in the signals that is longer than the largest run length represented by a single RL code is represented by at least one no-change RL code and an RL code representing a remainder value, wherein the no-change RL code represents a portion of the long run and also indicates that the immediately following RL code corresponds to a continuation of the long run. In a preferred embodiment, binary images are run-length encoded and the resulting run-length codes are subjected to variable-length encoding using structured Huffman tables.

28 Claims, 3 Drawing Sheets

METHOD AND APPARATUS FOR RUN-LENGTH ENCODING USING SPECIAL LONG-RUN CODES

BACKGROUND OF THE INVENTION

1. Field of the Invention

The present invention relates to signal processing, and, in particular, to run-length encoding of runs of digital signals (such as image pixels) having constant values.

2. Description of the Related Art

It is often desirable to reduce the number of bits used to represent digital images for more efficient storage and/or transmission. For example, in facsimile transmissions of documents, binary pixel images are generated and encoded for transmission to reduce the number of ones and zeros used represent the images. Run-length encoding is one standard technique used in encoding such binary images. In run-length encoding, the pixel data is replaced by values that represent the numbers of consecutive pixels in the original image data that have the same value, following some predefined pattern (e.g., raster scan pattern from left to right within rows and from top to bottom from row to row). Many binary images can be represented with fewer bits using run-length encoding than the number of bits found in the original pixel image.

Any new encoding scheme that represents the same information using fewer bits will constitute an improvement over the prior art. The present invention is such an encoding scheme. Objects and advantages of this invention will become apparent from the detailed description of a preferred embodiment which follows.

SUMMARY OF THE INVENTION

The present invention is directed to run-length encoding and decoding of signals representative of at least one of physical activities and physical objects. According to a preferred embodiment, magnitudes of runs of constant signal value in the signals are determined. The signals are converted to fixed-length run-length (RL) codes, wherein each long run in the signals that is longer than the largest run length represented by a single RL code is represented by at least one no-change RL code and an RL code representing a remainder value, wherein the no-change RL code represents a portion of the long run and also indicates that the immediately following RL code corresponds to a continuation of the long run.

BRIEF DESCRIPTION OF THE DRAWINGS

Other objects features, and advantages of the present invention will become more fully apparent from the following detailed description of the preferred embodiment, the appended claims, and the accompanying drawings in which:

DESCRIPTION OF THE PREFERRED EMBODIMENT(S)

Figure 1:
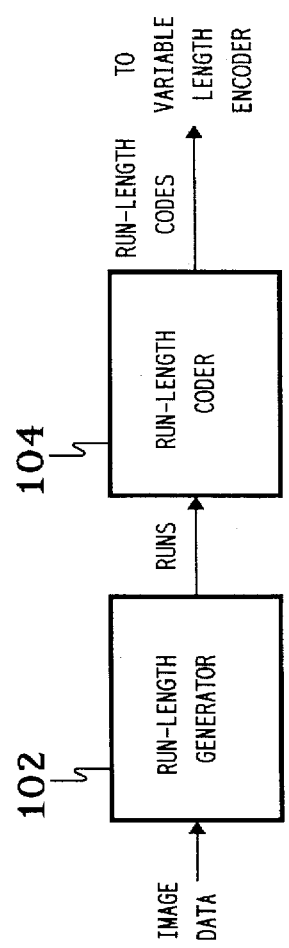
FIG. 1 is a block diagram of a run-length encoding system.

The present invention is applicable to any situation in which run-length encoding is used to encode data using fixed-length codes where the lengths of runs may exceed the largest value represented by a single fixed-length code. Examples of such situations include facsimile transmission of binary images, encoding of transparency masks used in video and other image processing applications, and encoding the definitions of image regions in image segmentation.

A goal of the present invention is to represent sequences of ones and zeros using fixed-length (e.g., 8-bit) run-length (RL) codes, where each fixed-length code corresponds to a run length. Since the RL codes are of fixed length, there is a maximum run length that can be represented by a single code. For example, when using 8-bit codes whose values are the corresponding run lengths (i.e., the value of the 8-bit RL code is the run-length value), 255 is the longest run length that can be represented by a single RL code.

Consider the following data sequence (A):

$$524, 270, 125, 314, 14, 255, 256, 510 \qquad (A)$$

which represents a run of 524 ones, followed by a run of 270 zeros, followed by a run of 125 ones, followed by a run of 314 zeros, followed by a run of 14 ones, followed by a run of 255 zeros, followed by a run of 256 ones, followed by a run of 510 zeros. In this example, the first run in any sequence corresponds (by convention) to a run of ones. Each successive value corresponds to a run of pixels of the other value, alternating between runs of zeros and runs of ones.

Under one possible run-length encoding scheme, large runs are encoded using zero-length runs. Under this scheme, runs of ones and zeros of length 1–255 are coded directly with those values (e.g., a run of 14 zeros is encoded using the 8-bit value for 14). Runs of length greater than 255 are coded as a run of 255 followed by a run of 0, followed by the remainder (which itself may involve more runs of 255 followed by 0). For example, the initial run of 524 ones in data sequence (A) is represented under this encoding scheme by (255, 0, 255, 0, 14), which represents a run of 255 ones, followed by a run of 0 followed by a run of 255 ones, followed by a run of 0 zeros, followed by a run of 14 ones. Thus, under this encoding scheme, the original data sequence (A) is represented by the following run-length code sequence (B):

$$255, 0, 255, 0, 14, 255, 0, 15, 125, 255, 0, 59, 14, 255, 255, 0, 1, 255, 0, 255 \qquad (B)$$

which represents a run of 255 ones, followed by a run of 0 zeros, followed by a run of 255 ones, followed by a run of 0 zeros, followed by a run of 14 ones, followed by a run of 255 zeros, followed by a run of 0 ones, followed by a run of 15 zeros, followed by a run of 125 ones, followed by a run of 255 zeros, followed by a run of 0 ones, followed by a run of 59 zeros, followed by a run of 14 ones, followed by a run of 255 zeros, followed by a run of 255 ones, followed by a run of 0 zeros, followed by a run of 1 one, followed by a run of 255 zeros, followed by a run of 0 ones, followed by a run of 255 zeros. Under this encoding scheme, the original data sequence (A) is represented by 20 8-bit code values, or a total of 160 bits.

Under another possible run-length encoding scheme, large runs are encoded using escape sequences. Under this scheme, as in the previous scheme, runs of ones and zeros of length 1–255 are coded directly with those values. Runs of length greater than 255, however, are coded with an escape code (e.g., using special escape code 0), followed by the actual run length, for example, represented as a 16-bit value. Thus, under this encoding scheme, the original data sequence (A) is represented by the following code sequence (C):

0, (524), 0, (270), 125, 0, (314), 14, 255, 0, (256), 0, (510)    (C)

which represents an escape sequence for the run of 524 ones, followed by an escape sequence for the run of 270 zeros, followed by the run of 125 ones, followed by an escape sequence for the run of 314 zeros, followed by the run of 14 ones, followed by the run of 255 zeros, followed by an escape sequence for the run of 256 ones, followed by an escape sequence for the run of 510 zeros. In this code sequence (C), for example, "0, (524)" represents the 8-bit escape code having the value 0 followed by 16 bits having value 524. Under this encoding scheme, the original data sequence (A) is represented by 8 8-bit code values and 5 16-bit values, or a total of 144 bits.

According to the run-length encoding scheme of the present invention, large runs are encoded using a special no-change code. Under this scheme, as in the two previous schemes, runs of ones and zeros of length 1–255 are coded directly with those values. Runs of length greater than 255, however, are coded using one or more no-change codes 0 followed by a remainder. The no-change code is a special RL code (having the value 0) that indicates a run of 255 followed by a run of the same value. The no-change code is different from the other run-length codes in that (a) it represents a length other than its (i.e., 255 instead of 0) and (b) it is followed by an RL code that represents a continuation of the same run, rather than a run of the alternate value (i.e., one or zero). Moreover, this embodiment of the encoding scheme of the present invention has two RL codes that represent the same length (i.e., both 0 and 255 represent runs of length 255).

Thus, under this embodiment of the present invention, the original data sequence (A) is represented by the following run-length code sequence (D):

(0, 0, 14, 0, 15, 125, 0, 59, 14, 255, 0, 1, 0, 255),    (D)

which represents a run of 255 ones, followed by a run of 255 ones, followed by a run of 14 ones, followed by a run of 255 zeros, followed by a run of 15 zeros, followed by a run of 125 ones, followed by a run of 255 zeros, followed by a run of 59 zeros, followed by a run of 14 ones, followed by a run of 255 zeros, followed by a run of 255 ones, followed by a run of 1 one, followed by a run of 255 zeros, followed by a run of 255 zeros. Those skilled in the art will recognize that, for example, at the end of the run-length code sequence (D), "0 255" represents the run of 510 zeros at the end of the original data sequence (A), where "0" represents a run of 255 to be followed by a continuation of the same run and "255" represents the remainder of that run. Under this encoding scheme, the original data sequence (A) is represented by 14 8-bit code values, or a total of only 112 bits. Thus, for the original data sequence (A), this embodiment of the encoding scheme of the present invention produces a run-length encoded sequence using fewer bits than the other two encoding schemes described above.

Not only does the encoding scheme of the present invention allow sequences with large runs to be encoded using fewer bits, but the present invention provides additional advantages over the other encoding schemes.

In the case of the encoding scheme based on zero-length runs (i.e., code sequence (B)), each run of 256 or greater requires a minimum of 3 symbols to code (and 2 more for each additional 255 pixels in the run). These symbols waste both space and decode time. In addition, the run-length code 255 is the last code in the list. In some encoding systems, the run-length codes are themselves further encoded using variable-length or statistical encoding, for example, based on Huffman tables. For a structured Huffman table, the last run-length code (255) is often represented by the longest variable-length code. For images with many runs that are longer than 255, the run-length code 255 will occur frequently and it is inefficient to encode values that occur frequently with long variable-length codes. Thus, Huffman encoding of these RL, code sequences will be less than optimally efficient.

In the case of the encoding scheme based on escape codes (i.e., code sequence (C)), the 16-bit values that are part of the escape sequence are not easy to encode statistically, because the 16-bit values are effectively random and would require the use of very large Huffman codes. Moreover, the operation of decoding an escaped run is very expensive (in terms of processing time), because it requires the decoder to enter a different "mode" where the decoder treats the 16 bits as a non-Huffman encoded value. This processing breaks such performance critical characteristics as effective branch prediction and cache hit rates.

The run-length encoding scheme of the present invention, however, does not suffer from these deficiencies. In terms of numbers of bits to encode, the preferred encoding scheme of the present invention (i.e., code sequence (D)) always uses fewer bits to encode than the encoding scheme based on zero-length runs (i.e., code sequence (B)) as long as there are one or more runs longer than 255. The preferred encoding scheme will also use fewer bits than the encoding scheme based on escape codes (i.e., code sequence (C)), except in circumstances in which there are a relatively large number of extremely long runs. Even in those situations, however, the present invention avoids the processing problems mentioned earlier that are associated with decoding encoded data having escape sequences. For those situations in which variable-length encoding is applied to the run-length codes, the preferred encoding scheme of the present invention has the advantage of using the value 0 for the special no-change RL code. This improves statistical encoding when using structured Huffman tables in which the value 0 is represented with a short (if not, the shortest) variable-length code.

Referring now to FIG. 1, there is shown a block diagram of a run-length encoding system, according to a preferred embodiment of the present invention. Run-length generator 102 of FIG. 1 receives binary image data and determines the lengths of runs of ones and zeros in that data. Run-length coder 104 receives the runs from run-length generator 102 and converts the runs to generate the run-length codes that may, for example, be passed to a variable-length coder for further (statistical) encoding.

The run-length encoding system of the present invention is preferably implemented in software on a general-purpose microprocessor manufactured by Intel Corporation, such as an i486™ microprocessor, Pentium® processor, or Pentium® Pro processor. Those skilled in the art will understand that alternative embodiments of the run-length encoding system are possible, including implementations in hardware and/or in software in other processor environments.

Figure 2:
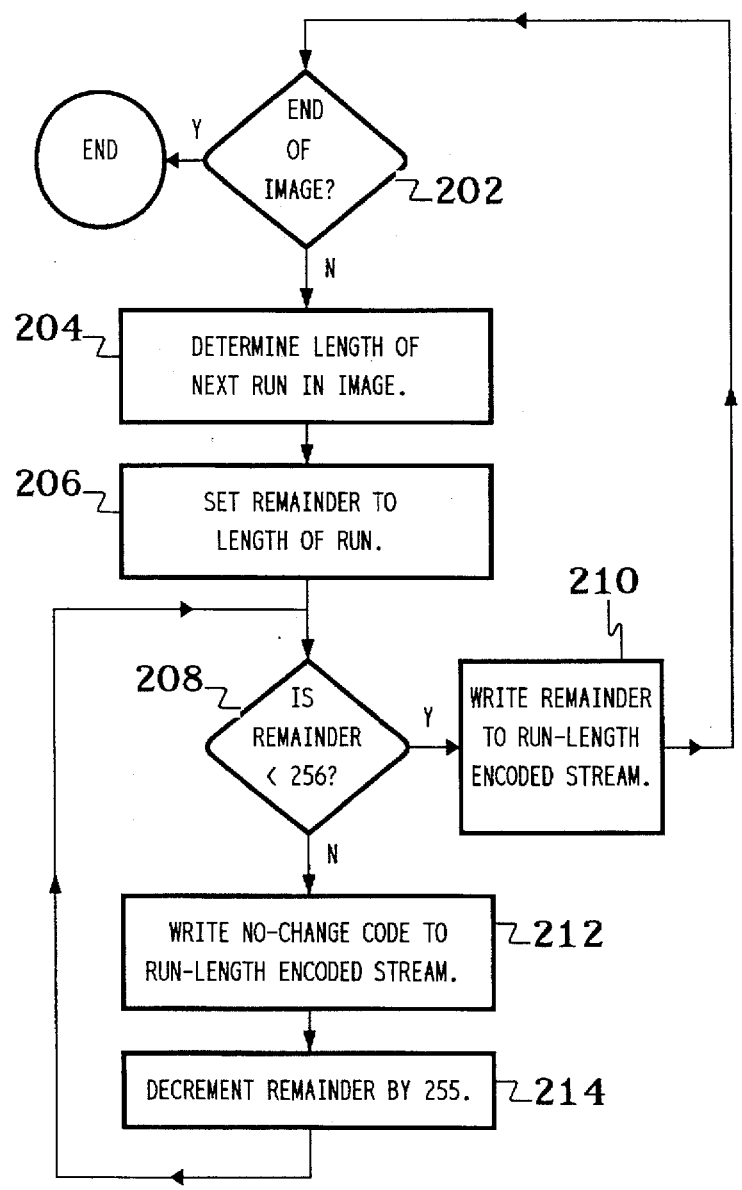
FIG. 2 is a flow diagram of the processing implemented by the run-length encoding system of FIG. 1.

Referring now to FIG. 2, there is shown a flow diagram of the processing implemented by the run-length encoding system of FIG. 1 to generate the run-length codes for a given binary image, according to a preferred embodiment of the present invention. Until the end of the image is reached (step 202 of FIG. 2), run-length generator 102 determines the length of the next run of signals (i.e., either ones or zeros) in the image (step 204). Run-length coder 104 sets a remainder parameter equal to that run length (step 206). If the remainder has a value less than 256 (step 208), then run-length coder 104 writes the remainder value as the run-length code to the run-length encoded (RLE) stream (step 210) and processing returns to step 202 to determine whether the end of the image has been reached. Otherwise, the remainder is greater than 255 (step 208), in which case, run-length coder 104 writes the special no-change RL code (i.e., 0) to the RLE stream (step 212) and decrements the remainder by 255 (step 214). Processing then returns to repeat step 208 using the newly decremented remainder.

Figure 3:
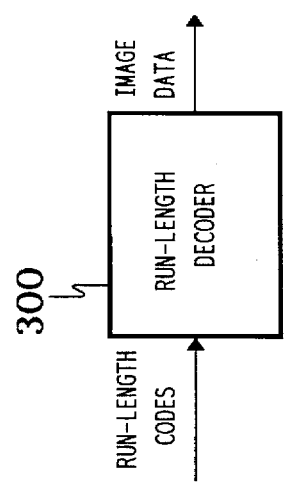
FIG. 3 is a block diagram of a run-length decoding system.

Referring now to FIG. 3, there is shown a block diagram of a run-length decoding system, according to a preferred embodiment of the present invention. Run-length decoder 300 receives the run-length codes generated by the run-length encoding system of FIG. 1 and decodes the run-length codes to generate run-length decoded image data.

As described above, the present invention can be used to run-length encode binary images. The present invention can also be used to encode multi-bit masks or multi-bit alpha channels. These binary and multi-bit data may exist in different contexts. They may be images of documents for facsimile transmission. They may be transparency masks used in video and other image processing. Binary or multi-bit masks may also be used to define image regions for image segmentation. Those skilled in the art will understand that the present invention can be used to run-length encode signals other than image signals. For example, run-length encoding may be used to encode the white spaces in text files. In general, the present invention may be used to run-length encode any suitable signals that are representative of or constituting physical activity or objects.

The present invention can be embodied in the form of methods and apparatuses for practicing those methods. The present invention can also be embodied in the form of computer program code embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments combine with the microprocessor to provide a unique device that operates analogous to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method for run-length encoding signals representative of at least one of physical activities and physical objects, comprising the steps of:

(a) determining magnitudes of runs of constant signal value in the signals; and (b) converting the signals to fixed-length run-length (RL) codes, wherein each long run in the signals that is longer than the largest run length represented by a single RL code is represented by at least one no-change RL code and an RL code representing a remainder value, wherein the no-change RL code represents a portion of the long run and also indicates that the immediately following RL code corresponds to a continuation of the long run.

2. The method of claim 1, wherein the no-change RL code has a value of 0.

3. The method of claim 1, wherein each RL code is an 8-bit value.

4. The method of claim 1, wherein the signals represent a binary image and the RL codes represent runs of ones and zeros.

5. The method of claim 1, wherein a run that is more than two times greater than the largest run represented by a single RL code is represented by at least two consecutive no-change RL codes followed by a RL code representing the remainder value.

6. The method of claim 1, wherein the no-change RL code and a different RL code both represent a run of the same length.

7. The method of claim 1, further comprising the step of statistically encoding the RL codes.

8. The method of claim 1, wherein:

the signals represent a binary image;

the RL codes are 8-bit values representing runs of ones and zeros;

the longest RL code represents a run of 255;

the no-change RL code has a value of 0 and represents a run of 255;

a run that is longer than 510 is represented by at least two consecutive no-change RL codes followed by a RL code representing the remainder value; and further comprising the step of statistically encoding the RL codes using a structured Huffman table.

9. A method for decoding run-length encoded signals representative of at least one of physical activities and physical objects, comprising the steps of:

(1) providing fixed-length run-length (RL) codes; and (2) decoding the RL codes to generate run-length decoded signals, wherein each long run in the signals that is longer than the largest run length represented by a single RL code is represented by at least one no-change RL code and an RL code representing a remainder value, wherein the no-change RL code represents a portion of the long run and also indicates that the immediately following RL code corresponds to a continuation of the long run.

10. The method of claim 9, wherein the no-change RL code has a value of 0.

11. The method of claim 9, wherein each RL code is an 8-bit value.

12. The method of claim 9, wherein the signals represent a binary image and the RL codes represent runs of ones and zeros.

13. The method of claim 9, wherein a run that is more than two times greater than the largest run represented by a single RL code is represented by at least two consecutive no-change RL codes followed by a RL code representing the remainder value.

14. The method of claim 9, wherein the no-change RL code and a different RL code both represent a run of the same length.

15. The method of claim 9, further comprising the step of statistically decoding variable-length codes to generate the RL codes.

16. The method of claim 9, wherein:

the signals represent a binary image;

the RL codes are 8-bit values representing runs of ones and zeros;

the longest RL code represents a run of 255;

the no-change RL code has a value of 0 and represents a run of 255;

a run that is longer than 510 is represented by at least two consecutive no-change RL codes followed by a RL code representing the remainder value; and further comprising the step of statistically decoding variable-length codes to generate the RL codes using a structured Huffman table.

17. An apparatus for run-length encoding signals representative of at least one of physical activities and physical objects, comprising:

(a) means for determining magnitudes of runs of constant signal value in the signals; and (b) means for converting the signals to fixed-length run-length (RL) codes, wherein each long run in the signals that is longer than the largest run length represented by a single RL code is represented by at least one no-change RL code and an RL code representing a remainder value, wherein the no-change RL code represents a portion of the long run and also indicates that the immediately following RL code corresponds to a continuation of the long run.

18. The apparatus of claim 17, wherein:

the signals represent a binary image;

the RL codes are 8-bit values representing runs of ones and zeros;

the longest RL code represents a run of 255;

the no-change RL code has a value of 0 and represents a run of 255;

a run that is longer than 510 is represented by at least two consecutive no-change RL codes followed by a RL code representing the remainder value; and further comprising means for statistically encoding the RL codes using a structured Huffman table.

19. A storage medium having stored thereon machine-readable program code for run-length encoding signals representative of at least one of physical activities and physical objects, wherein, when the program code is executed by a machine, the machine implements the steps of:

(a) determining magnitudes of runs of constant signal value in the signals; and (b) converting the signals to fixed-length run-length (RL) codes, wherein each long run in the signals that is longer that the largest run length represented by a single RL code is represented by at least one no-change RL code and an RL code representing a remainder value, wherein the no-change RL code represents a portion of the long run and also indicates that the immediately following RL code corresponds to a continuation of the long run.

20. The storage medium of claim 19, wherein:

the signals represent a binary image;

the RL codes are 8-bit values representing runs of ones and zeroes;

the longest RL code represents a run of 255;

the no-change RL code has a value of 0 and represents a run of 255;

a run that is longer than 510 is represented by at least two consecutive no-change RL codes followed by a RL code representing the remainder value; and further comprising the step of statistically encoding the RL codes using a structured Huffman table.

21. An apparatus for run-length encoding signals representative of at least one of physical activities and physical objects, comprising:

(a) a run-length generator; and (b) a run-length coder, wherein:

the run-length generator determines magnitudes of runs of constant signal value in the signals; and the run-length coder converts the signals to fixed-length run-length (RL) codes, wherein each long run in the signals that is longer than the largest run length represented by a single RL code is represented by at least one no-change RL code and an RL code representing a remainder value, wherein the no-change RL code represents a portion of the long run and also indicates that the immediately following RL code corresponds to a continuation of the long run.

22. The apparatus of claim 21, wherein:

the signals represent a binary image;

the RL codes are 8-bit values representing runs of ones and zeros;

the longest RL code represents a run of 255;

the no-change RL code has a value of 0 and represents a run of 255;

a run that is longer than 510 is represented by at least two consecutive no-change RL codes followed by a RL code representing the remainder value; and further comprising means for statistically encoding the RL codes using a structured Huffman table.

23. An apparatus for decoding run-length encoded signals representative of at least one of physical activities and physical objects, comprising:

(1) means for providing fixed-length run-length (RL) codes; and (2) means for decoding the RL codes to generate run-length decoded signals, wherein each long run in the signals that is longer than the largest run length represented by a single RL code is represented by at least one no-change RL code and an RL code representing a remainder value, wherein the no-change RL code represents a portion of the long run and also indicates that the immediately following RL code corresponds to a continuation of the long run.

24. The apparatus of claim 23, wherein:

the signals represent a binary image;

the RL codes are 8-bit values representing runs of ones and zeros;

the longest RL code represents a run of 255;

no-change RL code has a value of 0 and represents a run of 255;

a run that is longer than 510 is represented by at least two consecutive no-change RL codes followed by a RL code representing the remainder value; and further comprising means for statistically decoding variable-length codes to generate the RL codes using a structured Huffman table.

25. A storage medium having stored thereon machine-readable program code for decoding run length encoded signals representative of at least one of physical activities and physical objects, wherein the program code is executed by a machine, the machine implements the steps of:

(1) providing fixed-length run-length (RL) codes; and (2) decoding the RL codes to generate run-length decoded signals, wherein each long run in the signals that is longer than the largest run length represented by a single RL code is represented by at least one no-change RL code and an RL code representing a remainder value, wherein the no-change RL code represents a portion of the long run and also indicates that the immediately following RL code corresponds to a continuation of the long run.

26. The storage medium of claim 19, wherein:

the signals represent a binary image;

the RL codes are 8-bit values representing runs of ones and zeroes;

the longest RL code represents a run of 255;

the no-change RL code has a value of 0 and represents a run of 255;

a run that is longer than 510 is represented by at least two consecutive no-change RL codes followed by a RL code representing the remainder value; and further comprising the step of statistically decoding variable-length codes to generate the RL codes using a structured Huffman table.

27. A run-length decoder for decoding run-length encoded signals representative of at least one of physical activities and physical objects, wherein:

the run-length decoder receives fixed-length run-length (RL) codes; and the run-length decoder decodes the RL codes to generate run-length decoded signals, wherein each long run in the signals that is longer than the largest run length represented by a single RL code is represented by at least one no-change RL code and an RL code representing a remainder value, wherein the no-change RL code represents a portion of the long run and also indicates that the immediately following RL code corresponds to a continuation of the long run.

28. The run-length decoder of claim 27, wherein:

the signals represent a binary image;

the RL codes are 8-bit values representing runs of ones and zeros;

the longest RL code represents a run of 255;

the no-change RL code has a value of 0 and represents a run of 255;

a run that is longer than 510 is represented by at least two consecutive no-change RL codes followed by a RL code representing the remainder value; and further comprising means for statistically decoding variable-length codes to generate the RL codes using a structured Huffman table.

* * * * *